United States Patent
Fraasch et al.

(10) Patent No.: US 7,688,927 B2
(45) Date of Patent: Mar. 30, 2010

(54) METHOD AND APPARATUS FOR CLOCK RECOVERY

(75) Inventors: Steven J. Fraasch, Maple Grove, MN (US); Russell E. Cook, Jr., Maple Grove, MN (US); Jan B Wilstrup, Mounds View, MN (US); Peng Li, Palo Alto, CA (US)

(73) Assignee: Gigamax Technologies, Inc., Eden Prairie, MN (US)

( * ) Notice: Subject to any disclaimer, the term of this patent is extended or adjusted under 35 U.S.C. 154(b) by 861 days.

(21) Appl. No.: 11/314,728

(22) Filed: Dec. 20, 2005

(65) Prior Publication Data
US 2006/0193418 A1    Aug. 31, 2006

Related U.S. Application Data

(60) Provisional application No. 60/638,364, filed on Dec. 20, 2004.

(51) Int. Cl.
*H04L 7/00* (2006.01)
*H04L 25/00* (2006.01)
*H04L 25/40* (2006.01)

(52) U.S. Cl. .................................................. 375/371
(58) Field of Classification Search ................. 327/291, 327/164–165, 172–175, 178, 180; 375/285, 375/371, 355
See application file for complete search history.

(56) References Cited

U.S. PATENT DOCUMENTS 5,276,712 A * 1/1994 Pearson ...................... 375/360

* cited by examiner

*Primary Examiner*—Jean B Corrielus

(57) ABSTRACT

A clock recovery system includes a rough clock generator, which yields a rough clock signal, based upon logic level transitions exhibited by a data signal. The rough clock signal is supplied to a phase locked loop having an adjustable order of frequency response, an adjustable corner frequency, an adjustable natural frequency, and/or an adjustable damping factor. The clock recovery system includes control parameters that, when properly adjusted, suppress non-ideal effects of components within the clock recovery system, and also permit the frequency response of the phase locked loop to be returned to a desired response.

6 Claims, 18 Drawing Sheets

METHOD AND APPARATUS FOR CLOCK RECOVERY

RELATED APPLICATIONS

This application claims the benefit of U.S. Provisional Patent Application No. 60/638,364, filed on Dec. 20, 2004, and entitled "METHOD AND APPARATUS FOR CLOCK RECOVERY," which is hereby incorporated by reference for all it teaches.

FIELD OF THE INVENTION

The invention relates generally to waveform analyzers, and more particularly to clock recovery circuits for use in waveform analyzers.

BACKGROUND

As network designers increase bandwidth, it is increasingly important to specify signal integrity standards for electrical physical interfaces, regardless of whether the interface is internal routing within an integrated circuit, a signal between circuits on printed circuit media, or an external signal such as that on an outdoor cable or optical fiber. Assuming the signals are digital, a problem that is becoming more difficult as data rates increase is the inability to control the propagation delay of a group of signals such that they arrive at their destinations simultaneously. A proposed solution is to multiplex individual digital signals into one "fast" serial data line, such that one transmitter, transmission line and receiver combine, transmit, propagate, and decode a large grouping of digital signals.

Although this multiplexing approach eliminates the synchronicity problem between bundles of signals, it invites other problems such as reception of the data by a receiver whose clock is not phase synchronous with the incoming high-speed data. To solve this problem, a process known as "clock recovery" is applied where the receiver generates a clock that is phase-synchronous with the incoming data stream. Since the clock recovery solution must be applied to systems or integrated circuits or "chips" that communicate with other systems or chips, it is necessary that companies developing these systems comply with the same industry-accepted standard. Similarly, companies who provide test equipment claiming test compliance must insure the accuracy of their measurements such that results obtained comply (or do not comply) with the same standards.

The methods and apparatus of the present application were developed and applied as a consequence of developing compliant clock recovery test equipment.

While investigating existing forms of clock recovery, it was found that current methods and commercial offerings were unable to provide the necessary accuracy to measure random and deterministic jitter in accordance with industry standards. Shortcomings include:

1.) The inability to acquire and lock to serial data patterns ranging from periodic to pseudo-random data streams.
2.) The inability to acquire and lock to serial data streams with low or sparse transition density.
3.) Vague or undefined phase lock loop characteristic (order, amplitude and phase response).
4.) In the case of specified phase lock loop characteristics, the tolerance of order, amplitude and phase response was too loose.
5.) Inability of systems to self-test or assert their PLL order, amplitude and phase response.
6.) Inability of systems to measure random and deterministic jitter tracked by the phase lock loop.
7.) Inability of systems to recover serial data at microwave frequency data rates.

In view of the foregoing, there arises a need for an improved clock recovery method and apparatus. The following addresses and helps to solve and/or minimize the shortcomings of the prior art.

SUMMARY

To overcome the above identified shortcomings, a clock recovery system was developed that complies with industry-defined standards. Therefore, the present invention may include one or more of the following methods and apparatus:

1.) A rough clock receiver capable of generating continuous edge transitions on high rate data signals with low transition density.
2.) A high comparison rate, low noise, phase detector with adjustable gain.
3.) A phase lock loop with adjustable low-pass order, amplitude and phase response.
4.) A discrete time sampler or "digitizer" capable of sampling the phase lock loop error signal.
5.) An FFT process capable of converting digitizer time domain samples into the frequency domain.
6.) Methods to accurately adjust the rough clock for minimum deterministic jitter transfer.
7.) Methods to accurately adjust and measure the phase lock loop to desired order, amplitude and phase response.
8.) Methods to measure in-loop jitter.

It will be appreciated that the present invention need not include each and every one of the preceding features. Instead, methods and apparatus constructed in accordance with the principles of the present invention may utilize one or more of the identified features.

While the invention will be described with respect to preferred embodiment configurations and with respect to particular devices used therein, it will be understood that the invention is not to be construed as limited in any manner by either such configuration or components described herein. These and other variations of the invention will become apparent to those skilled in the art upon a more detailed description of the invention.

For a better understanding of the invention, reference should be had to the drawings which form a part hereof and to the accompanying descriptive matter, in which there is illustrated and described a preferred embodiment of the invention.

BRIEF DESCRIPTION OF THE DRAWINGS

Referring to the drawings, wherein like numerals represent like parts throughout the several views.

DETAILED DESCRIPTION

Figure 17:
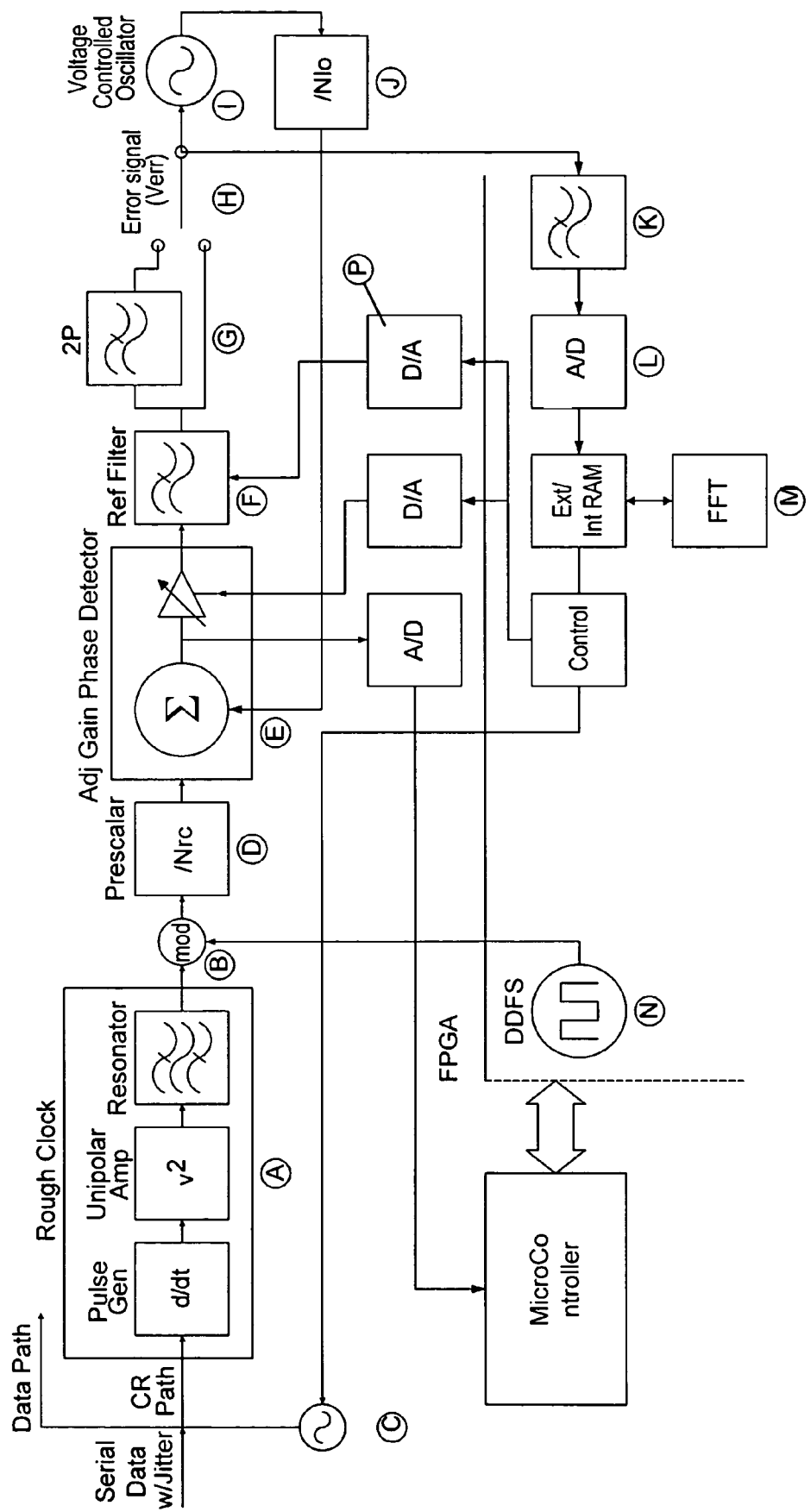
FIG. 17 illustrates a clock recovery system embodying several features of the present invention.

As noted above, there are eight features of the present invention. Each will be discussed in detail below. In connection with the sections, reference should be had to FIGS. 17 and 18.

I. A Procedure to Characterize the Frequency Response of a PLL Using a DDFS and Voltage Digitizer
1. Excite the PLL Rough Clock at Frc by enabling the Calibration Source (C) (or through the application an input signal).
2. Apply a set of default settings to the PLL for the Prescaler blocks (D & J), the VCO Bias (P) and the Phase Detector Gain (E).
3. Lock the PLL by sweeping the DC Bias ( ) until the duty cycle at output of the Phase Detector is 50%.
4. Program the DDFS (N) to the desired frequency Fddfs such that two conditions are met:
   a. The frequency of interest should land exactly in a bin. This can be done when the DDFS and FFT are using the same clock source and the the DDFS resolution is a sub-multiple of the FFT resolution.
   b. The amplitude of the DDFS should be sufficiently small so that the loop remains locked.
5. Digitize Verr(t) (input to VCO) using (K) and apply the FFT function (M).
6. Read the FFT bin corresponding to the DDFS frequency and apply the required source compensation that results in the DDFS output having a flat amplitude and constant phase.
7. Since the goal of the characterization is to know the loop characteristic at the VCO output an additional compensation of Kvco/s is applied to obtain this result.
8. Compute the Amplitude and Phase Response from the complex result of Step 7.
9. Apply steps 4 through 8 for multiple frequencies through-out the expected frequency response. (i.e. Fstart<<Fcorner, Fstop>>Fcorner).

II. A Procedure to Characterize the Amplitude Response of a PLL Using a Gaussian White Noise Source and Voltage Digitizer
1. Excite the PLL Rough Clock at Frc by enabling the Calibration Source (C) (or applying an input signal).
2. Apply a set of default settings to the PLL for the Prescaler blocks (D & J), the VCO Bias (P) and the Phase Detector Gain (E).
3. Lock the PLL by sweeping the DC Bias (P) until the duty cycle at output of the Phase Detector is 50%.
4. Program the AWGN (N) source to the desired amplitude such that the loop remains locked.
5. Digitize Verr(t) (input to VCO) using (K) and apply the FFT function (M).
6. Read each FFT bin and apply appropriate compensation; Since the goal of the characterization is to know the loop characteristic at the VCO output the compensation of Kvco/s is applied to obtain this result.
7. Compute the Amplitude from the complex result.
8. Apply steps 5 through 7 for multiple passes, averaging the Magnitude for each bin over all passes.

III. A Procedure to Set the Corner Frequency of A PLL using a DDFS and Voltage Digitizer
1. Lock the PLL by apply steps 1 through 3 of "A Procedure to Characterize the Frequency Response of A PLL using a DDFS and Voltage Digitizer".
2. Choose a DDFS frequency that is well within the loop passband and meets the requirements of "A Procedure to Measure the Frequency Response of A PLL using a DDFS and Voltage Digitizer", step 4.
3. Digitize Verr(t) multiple times an average to reduce the noise floor of the measurement and compute the average of the Amplitude Response (at the VCO Output).
4. Convert the result of step 3 to decibels and store as Apeak.
5. Choose a DDFS frequency that is close to the corner frequency (within a known tolerance) and meets the requirements of "A Procedure to Characterize the Frequency Response of A PLL using a DDFS and Voltage Digitizer", step 4.
6. Repeat Steps 3 & 4.
7. If (Apeak−Acorner) is within a known tolerance of 3 dB then save the gain setting for the Phase Detector (E) and stop,
   Else if (Apeak−Acorner) is less than 3 dB the corner frequency is too low, increment the phase detector gain and repeat steps 6 & 7,
   Else if (Apeak−Acorner) is greater than 3 dB the corner frequency is too high, decrement the phase detector gain and repeat steps 6 & 7,
8. It should be noted that any variety of search algorithms may be applied including but not limited to Linear and Binary methods.
9. It should also be noted that the corner frequency and gain variables may be searched in a reverse method.

IV. A Procedure to Set the Corner Frequency of A PLL Using an Additive White Gaussian Noise Source and Voltage Digitizer
1. Lock the PLL by apply steps 1 through 3 of "A Procedure to characterize the Amplitude Response of A PLL using a Gaussian White Noise Source and Voltage Digitizer".
2. Digitizer the results per steps 4 through 8 of "A Procedure to characterize the Amplitude Response of A PLL using a Gaussian White Noise Source and Voltage Digitizer".
3. Pick a low FFT bin (bin well within the expected passband) as the Peak Amplitude, then search through the FFT bins until the amplitude response drops by 3 dB.
   If the frequency associated with the bin (Fbin) is within a known tolerance of the desired corner frequency then save the gain setting and stop, Else if Fbin>Fc, the current corner frequency is too high, decrement the gain and repeat steps 1 & 2

Else if Fbin<Fc, the current corner frequency is too low, increment the gain and repeat steps 1 & 2

V. A Method to Minimize Re-Generated Deterministic Jitter by use of Sub-Harmonic Sin Wave, Down-Conversion and FFT in a Phase Lock Loop Clock Recovery System A method of suppressing non-ideal effects in a clock recovery system exhibited by a rough clock generator of the clock recovery system receiving a data signal is detailed in FIGS. 1 and 18. In this method a rough clock signal is received by the clock recovery system and is mixed down in the clock recovery system to a lower frequency, yielding a replicant rough clock signal. The replicant rough clock signal is then observed in the clock recovery system to identify energy in spectral bands not native to the replicant clock signal. The clock recovery system then adjusts one or more control parameters to reduce the energy in non-native spectral bands.

Figure 1:
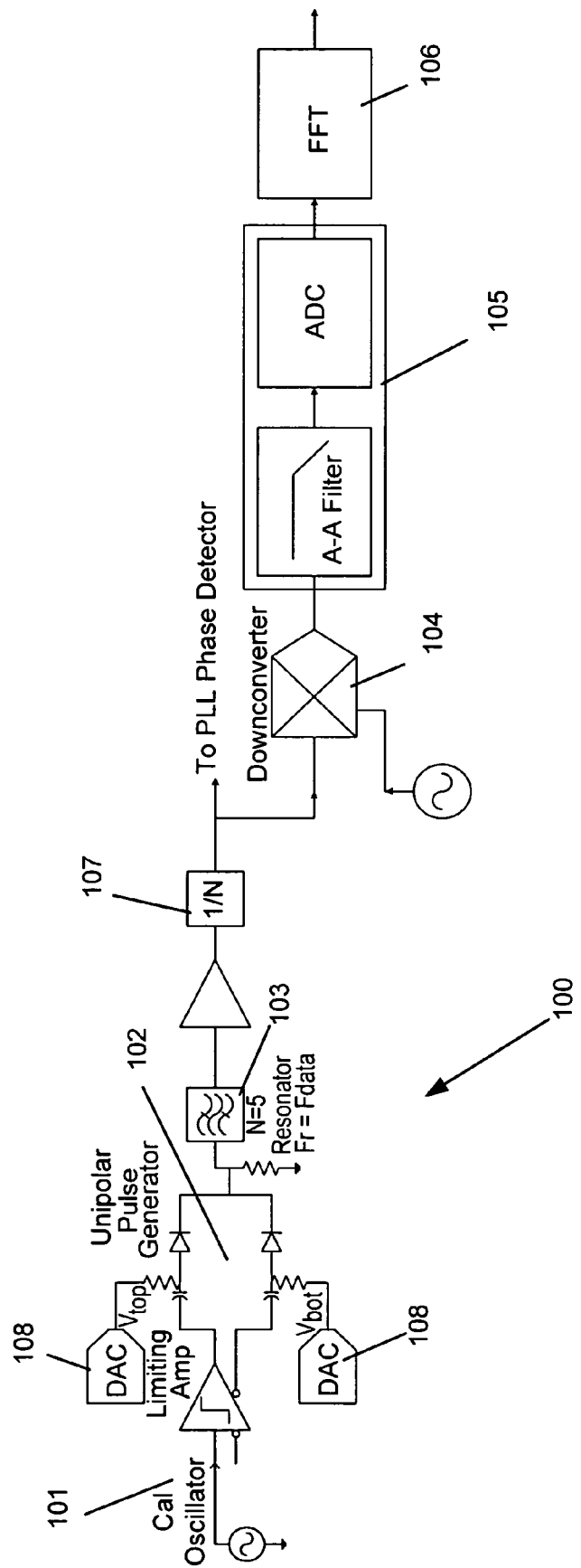
FIG. 1 depicts a clock recovery rough clock system according to one embodiment of the present invention.
Figure 2:
FIG. 2 depicts the positive pulses generated by uni-polar pulse generator 102 from each positive or negative transition.
Figure 18:
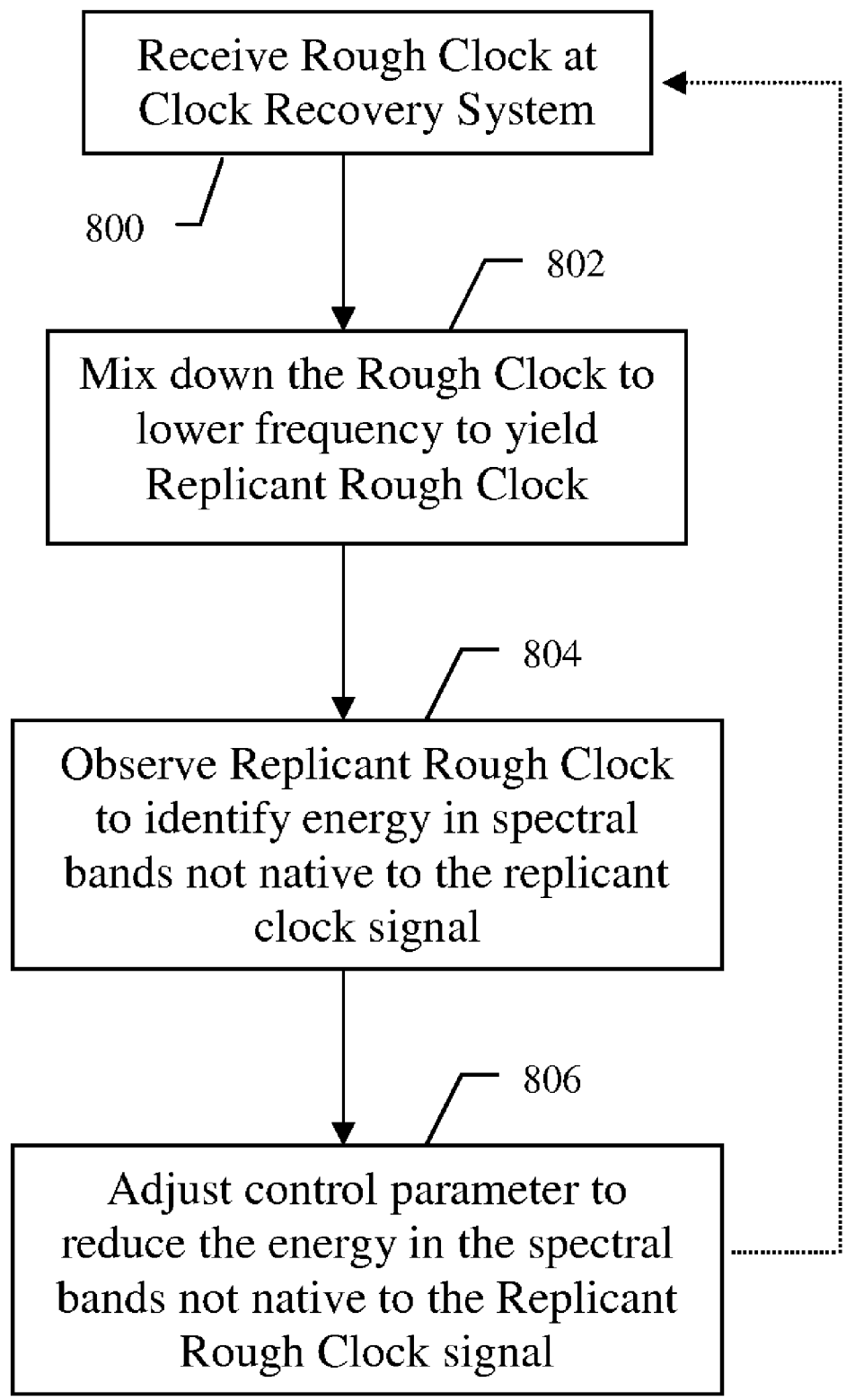
FIG. 18 illustrates a flowchart of a clock recovery system embodying several features of the present invention.

A serial data signal is applied to a clock recovery rough clock system at 100 in FIG. 1 and at 800 in the flowchart of FIG. 18. The signal is passed to a uni-polar pulse generator 102 including two Schottkey diodes which create positive going impulses on every positive and negative transition. FIG. 2 illustrates the uni-polar pulses.

Figure 3:
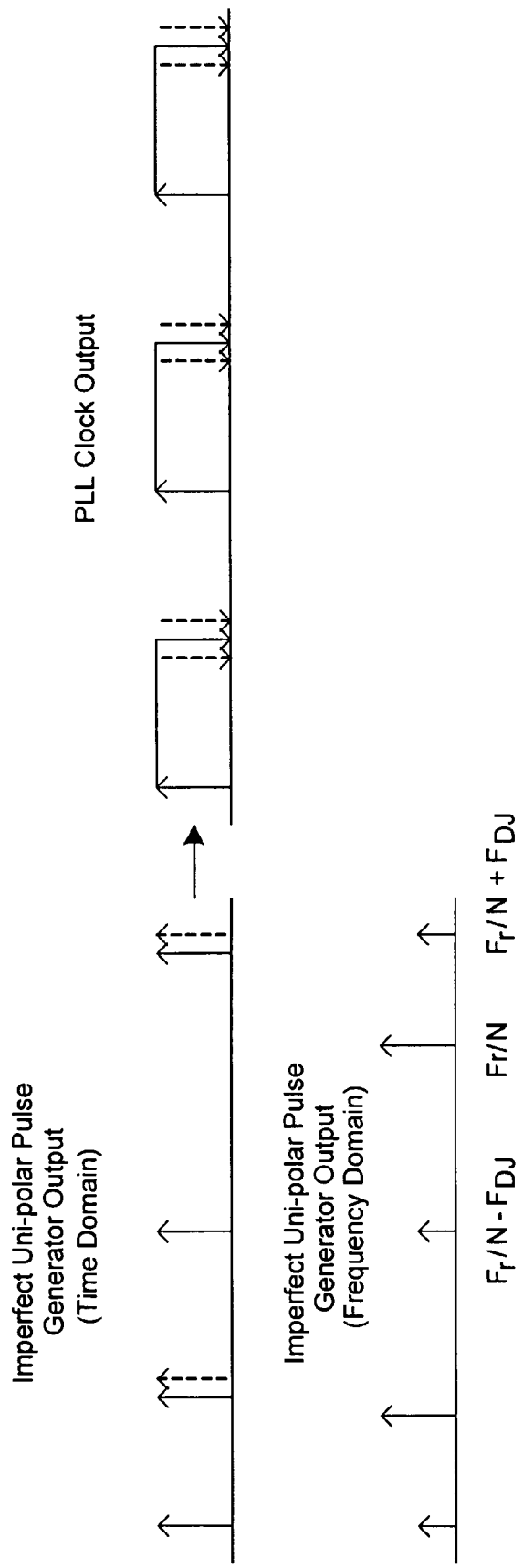
FIG. 3 depicts the PLL clock output with the uni-polar pulse generator 102 input illustrated in both the time domain and the frequency domain.

Due to component imperfections in the uni-polar pulse generator 102, the edges will not be perfectly aligned with the data unit interval. These misaligned edges will cause spurious sidebands, and will modulate the error signal causing deterministic jitter (DJ) in a phase locked loop. FIG. 3 illustrates the PLL clock output. In order to eliminate the spurious sidebands, it is possible to excite the PLL rough clock at the peaking filter's 103 resonance via a calibration source oscillator at an even sub-multiple of the input data 101 data rate. The peaking filter 103 is preferably tuned to the same frequency as the data rate ($F_{res}=F_{data}$).

Figure 4:
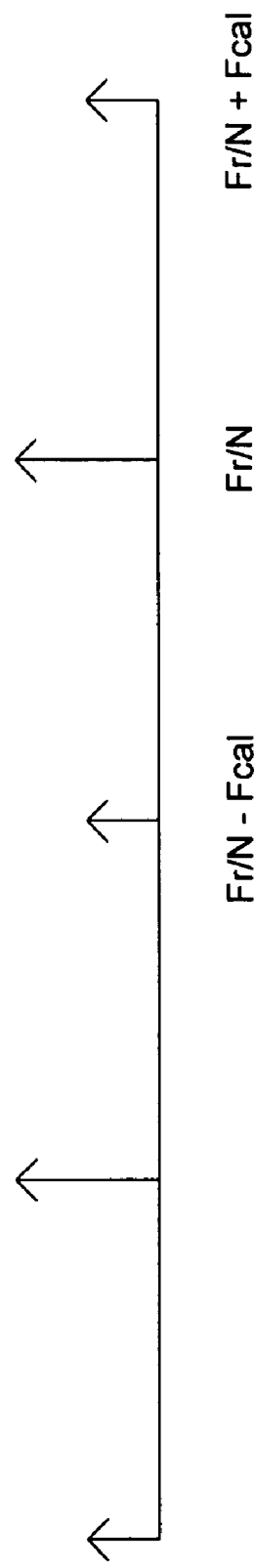
FIG. 4 illustrates the FFT operator 106 output.

As noted above, imperfections in the uni-polar pulse generator 102 will create spurious sidebands (similar to the deterministic jitter sidebands created by a serial data signal). The sidebands may be measured by use of a down-converter 104, 802, analog-to-digital converter 105 and Fast Fourier Transform (FFT) operator 106 connected to the clock divider output 107. FIG. 4 illustrates the FFT operator 106, 804 output.

While monitoring the FFT bin corresponding to the spurious product 804, a computer applies bias corrections 806 to the Schottky diodes via the digital-to-analog converters 108 until the sidebands are reduced to an insignificant level eliminating the transfer of deterministic jitter to the phase lock loop system. Alternatively (or in addition to adjustment of the bias corrections to the Schottky diodes), the resonant frequency of the resonator(s) in the rough clock generator may be adjusted 806. Still further, the threshold for the comparator (also known as a limiting amplifier) may be adjusted 806.

Adjustment of the bias applied to the Schottky diodes has the effect of adjusting the timing of the logic level transitions of the rough clock signal (i.e., the adjustments will tend to advance or retard the various transitions). Such adjustment may also cause the various pulses used to excite the resonators to be uniform in amplitude, and may also cause those pulses to exhibit a lesser degree of "smear," i.e., to appear more like impulse functions. Adjustment of the threshold applied to the comparator has the effect of adjusting the duty cycle of the rough clock signal.

Figure 5:
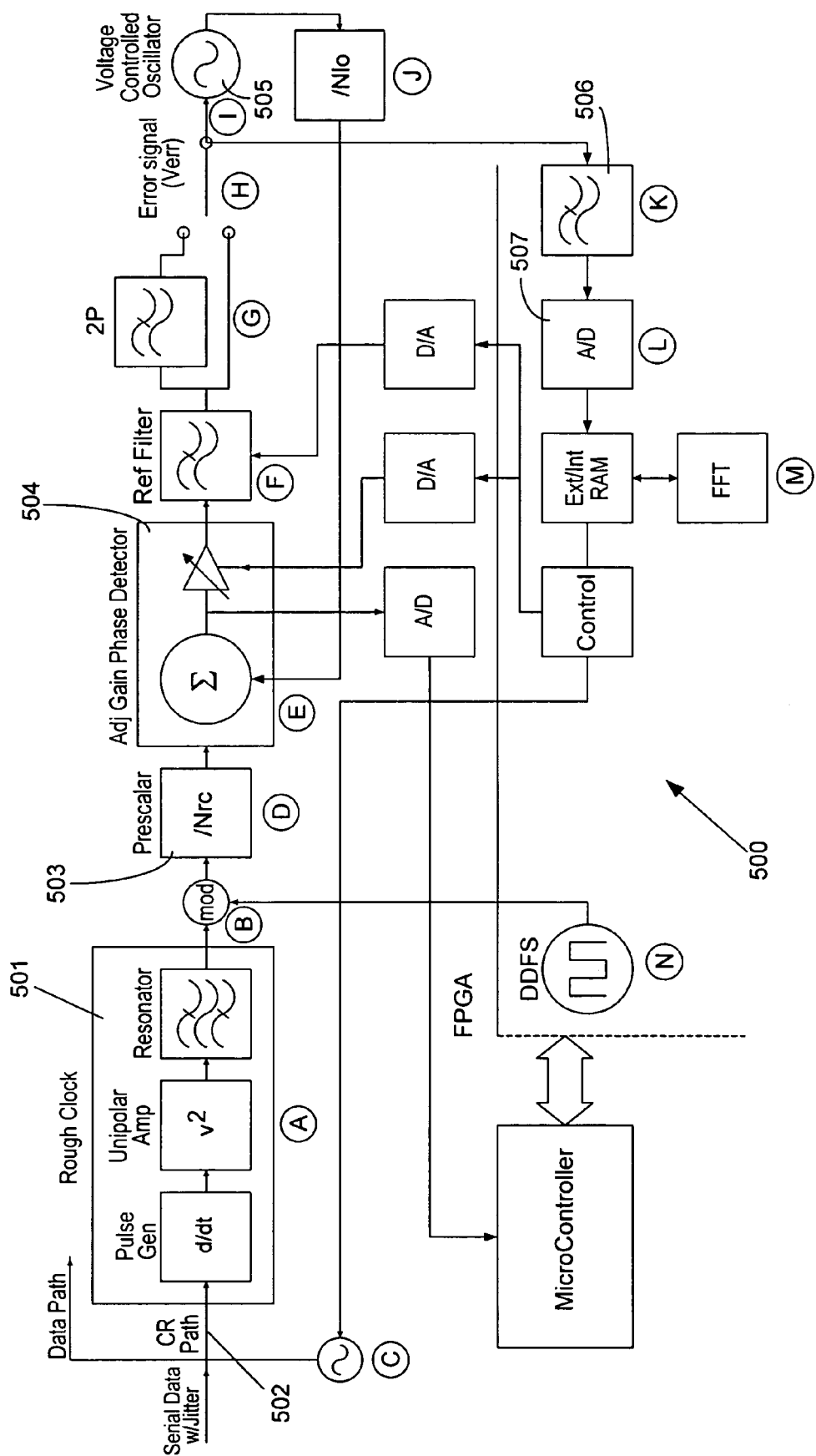
FIG. 5 illustrates a clock recovery system for obtaining phase lock loop (PLL) unit step response from equivalent time sampling.
Figure 6:
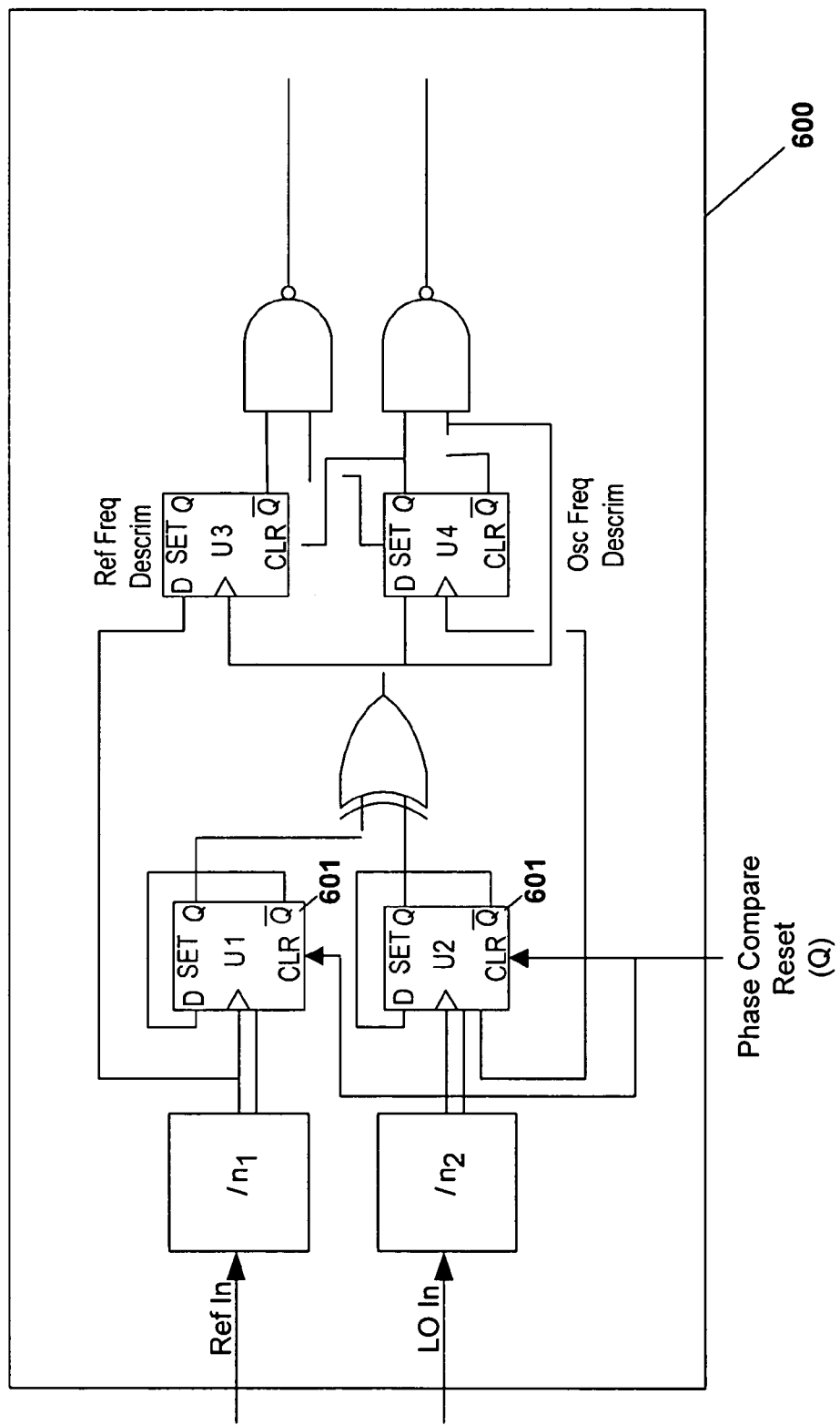
FIG. 6 illustrates the phase detector utilized in connection with the embodiment of FIG. 5.

VI. Procedure for Obtaining Phase Lock Loop (PLL) Unit Step Response from Equivalent Time Sampling The system is shown generally at 500 in FIG. 5. The PLL rough clock 501 is excited at the input 502 via a calibration source oscillator. Pre-scalar and phase detector gain settings are applied at blocks 503 and 504 (respectively) such that the PLL local oscillator 505 is able to acquire and phase lock to the rough clock signal. An instantaneous phase step is applied by resetting the phase comparators 601 shown in the phase detector 600 of FIG. 6. As the phase comparator 601 is reset, the phase lock loop will momentarily unlock, and re-lock according to loop gain and low-pass characteristics. The $V_{err}$(t) signal is then sampled and digitized at the input to the VCO 505 using a low-pass filter block 506 and A/D converter 507.

Figure 7:
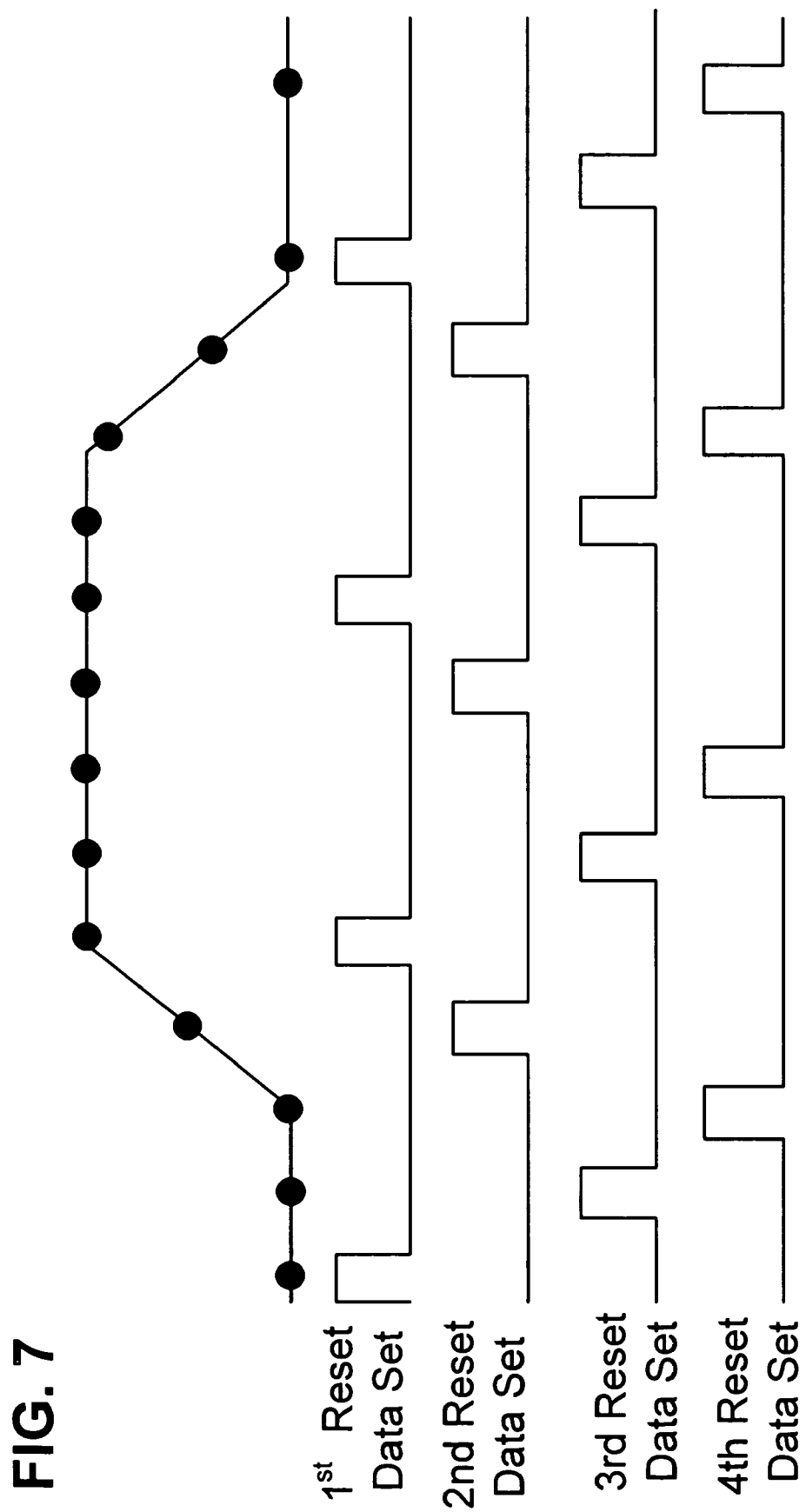
FIG. 7 illustrates an example of the reconstructed PLL unit step response from the equivalent time sampling of $V_{err}(t)$.

Since the closed-loop phase is not the same for each reset, the loop re-locking response is not time correlated to the instant the reset is applied. By repeating the reset, and collecting samples for each, the samples are collected and organized per FIG. 7. It is then possible to interpolate between the points to reconstruct the PLL unit step response. An example of the reconstructed PLL unit step response is shown in FIG. 7.

Figure 8:
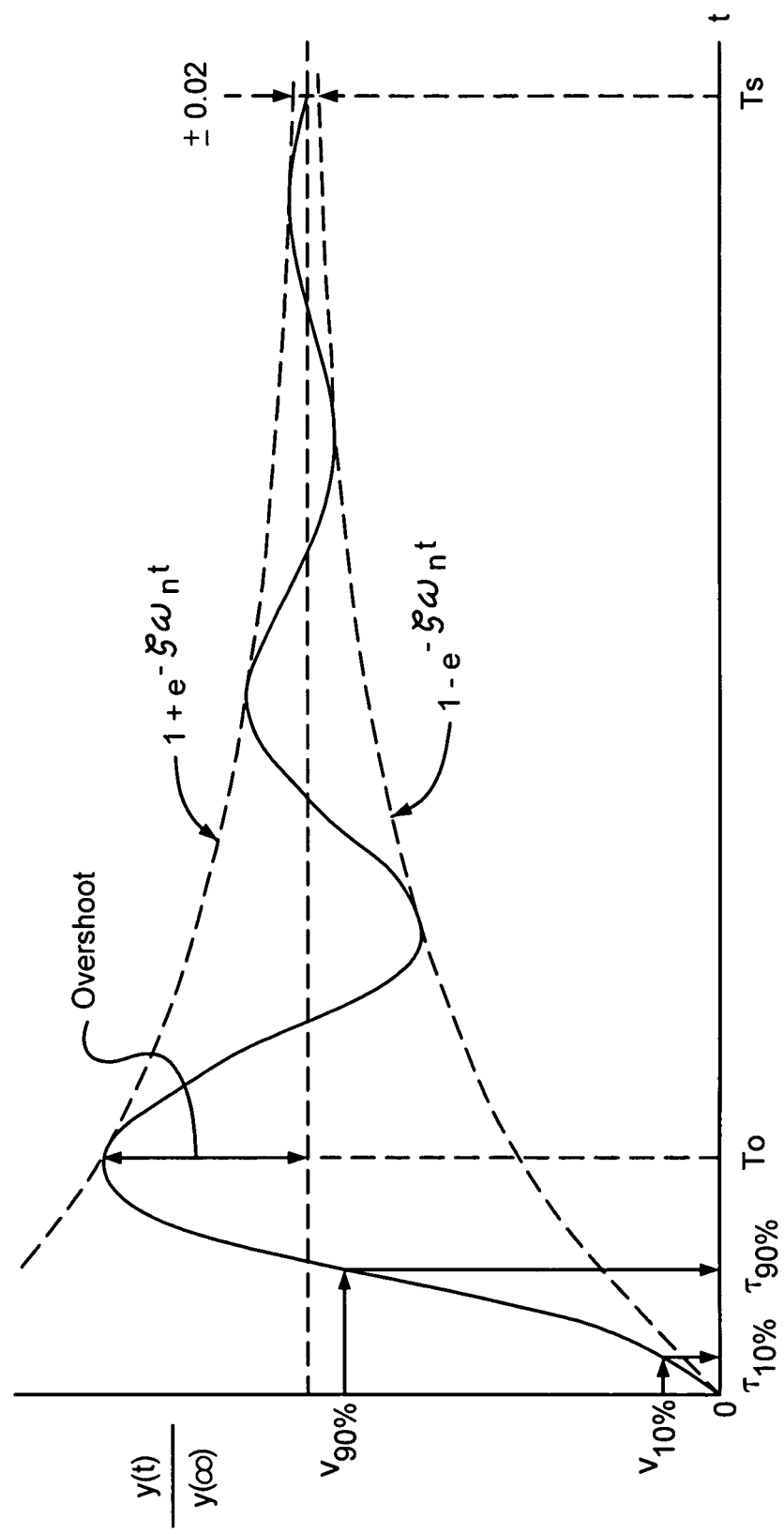
FIG. 8 illustrates the loop characteristics, including the 10-90% step response and damping factor, $\zeta$.

Once the interpolation is complete, it is then possible to discern the loop characteristics such as 10-90% step response and damping factor, $\zeta$ (FIG. 8).

VII. A Method to Provide an Adjustable Closed-Loop $1^{st}$ Order Phase Lock Loop Corner Frequency by Low Noise Means Various high-speed serial data communications standards specify a $1^{st}$ order low-pass function as the required filter for removing random and deterministic jitter below a desired corner frequency. Difficulty arises in attempting to adjust this filter corner, as the voltage-controlled oscillator (VCO) integrates changes in phase to accumulated phase or continuous frequency. Thus, the VCO acts as the low-pass element, and the addition of another filter with adjustable cut-off frequency merely adds to the loop filter order, thus violating the original $1^{st}$ order low-pass requirement.

Figure 9:
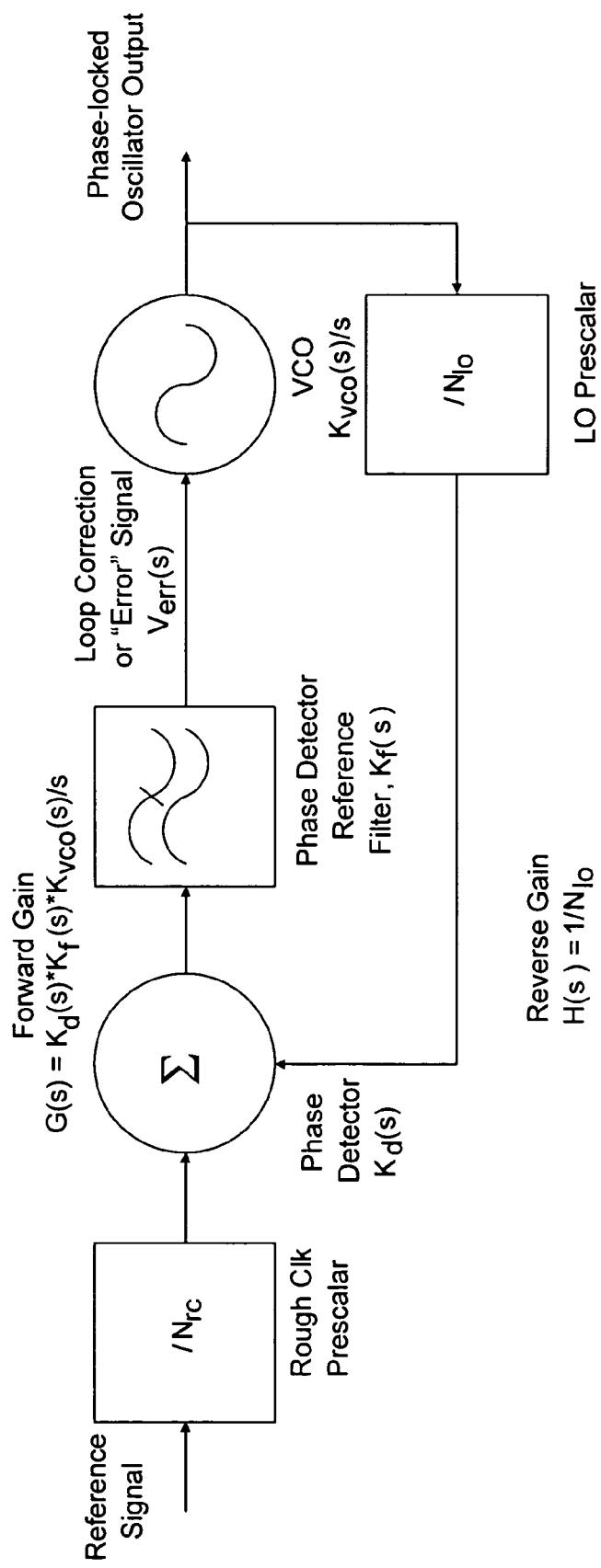
FIG. 9 illustrates a $1^{st}$ Order Linear Phase Lock Loop.

A linear phase lock loop model is shown in FIG. 9. A method of controlling the $1^{st}$ order loop PLL corner frequency will next be described. The closed-loop gain of the loop is given by the equation:

$$CLG(s) = \frac{1}{\frac{s*N_{RC}}{K_{pd}(s)*K_f(s)*K_{vco}(s)} + \frac{N_{RC}}{N_{LO}}} \qquad \text{Eqn. (1)}$$

where complex frequency, $s=j\omega$; $K_{pd}(s)$ and $K_{vco}(s)$ are the phase detector and VCO tuning gain constants, and $N_{rc}$, $N_{lo}$ are the pre-scalar divide constants. The low-pass reference filter, $K_f(s)$ is designed such that its poles are well beyond the PLL corner frequency; therefore, its effect on the $1^{st}$ order loop may be considered to be unity. As long as the reference filter poles are located far (at least 1 decade) from the desired low-pass PLL corner frequency, the stop-band will remain first order (−20 dB per decade). It is therefore possible to adjust the half-power or corner frequency of the $1^{st}$ order transfer function (1) by one degree of freedom, a gain constant.

Yet, most of the gain constants of the devices/functional blocks in FIG. 9 are not adjustable. For example, the pre-scalar phase dividers, $N_{rc}$ and $N_{lo}$, as well as the VCO tuning gain constant, $K_{vco}(s)$, are fixed; therefore, they do not afford an opportunity to adjust loop gain. The phase detector gain, $K_{pd}(s)$, does present an opportunity to adjust loop gain. Adjustment of phase detector gain can set the low-pass corner while avoiding the usual practice of adding an overt, passive pole and violating the $1^{st}$ order requirement.

Figure 10:
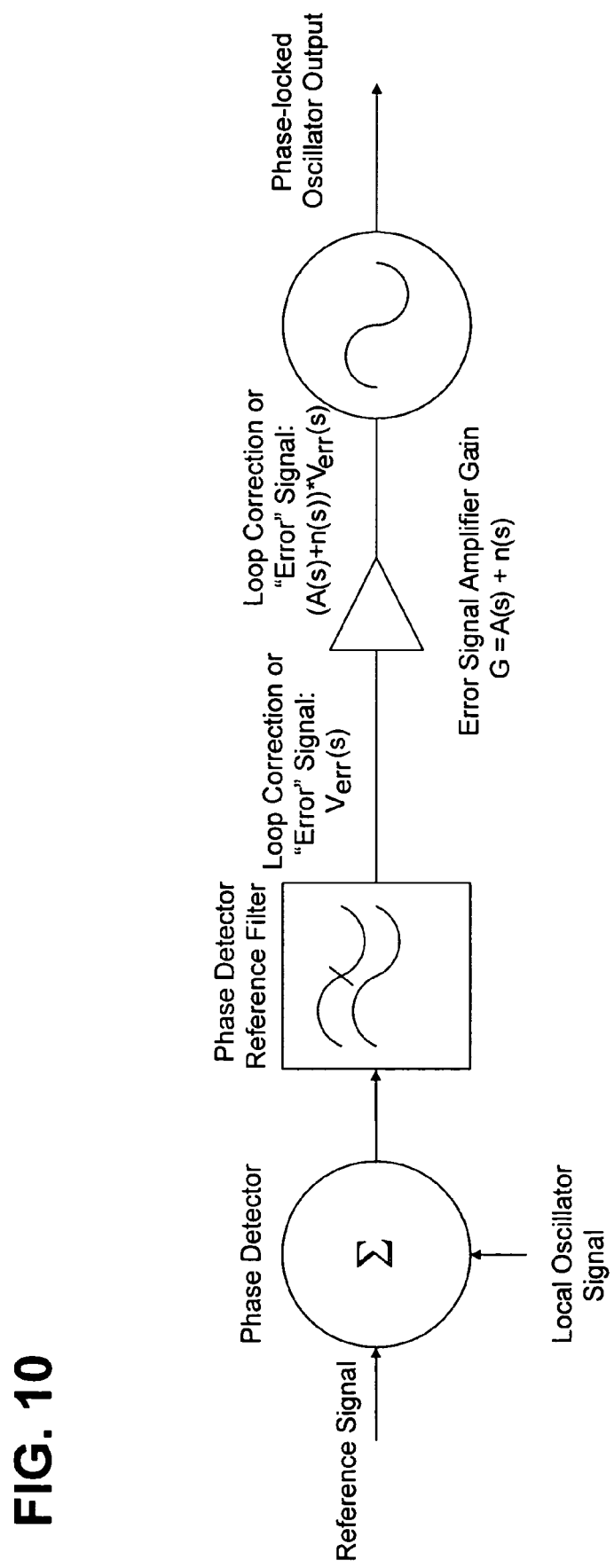
FIG. 10 illustrates a high noise forward gain model.

It is beneficial to adjust the phase detector gain through use of a low noise methodology. For example the order in which phase detection, reference phase filtering, and amplification are performed is important in determining the noise added to the phase lock loop output. Because the noise coefficient, n(s), precedes the amplifier gain, A(s), in the error signal amplifier, the implementation illustrated in FIG. 10 in the forward gain loop may generally result in high noise.

Figure 11:
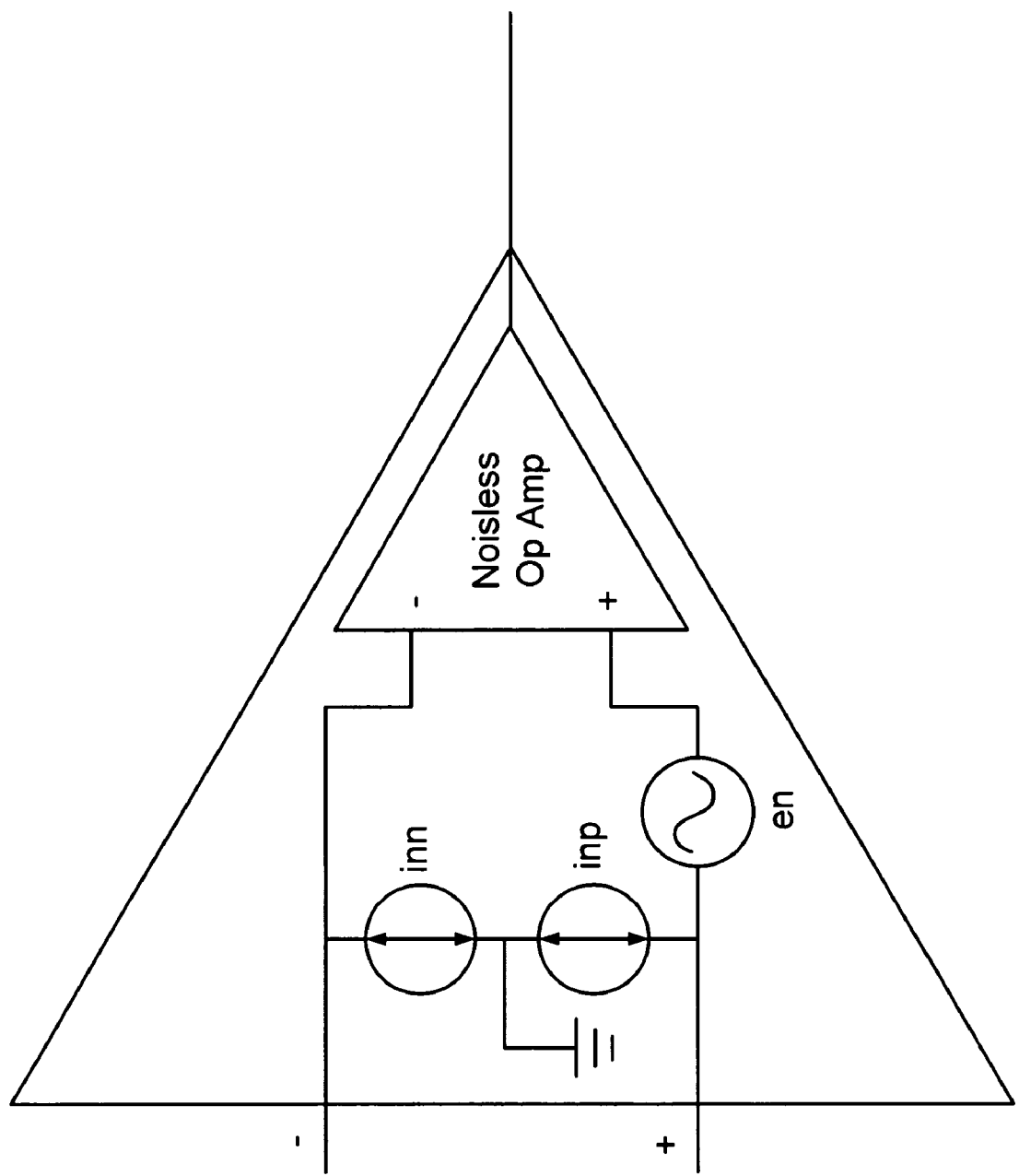
FIG. 11 illustrates an op-amp noise model.

The noise coefficient n(s) is unavoidable in linear amplifiers. It appears at the input of the amplifier such that the gain, A(s), operates not only on the signal but the noise constant as well. An op-amp noise model is shown in FIG. 11. Note that noise source precedes the amplifier.

An alternative method includes placing a limiting amplifier in the phase detector, such that the gain (and noise) is applied at the phase comparison radio frequency (RF). Since the reference filter leaves only a signal representing the running average of the reference and LO phases, the noise that is present at RF frequencies is removed. This methodology is illustrated in FIG. 12.

Figure 12:
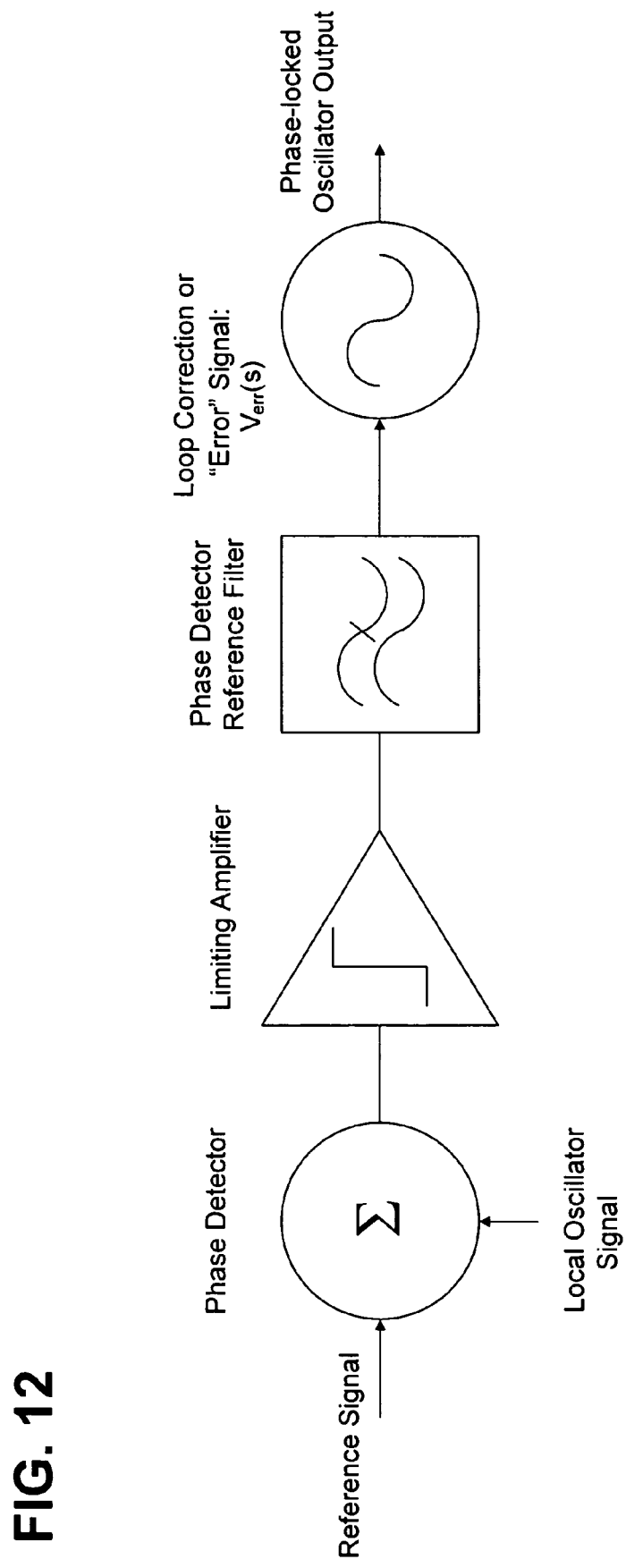
FIG. 12 illustrates a low noise, fixed forward gain model
Figure 13:
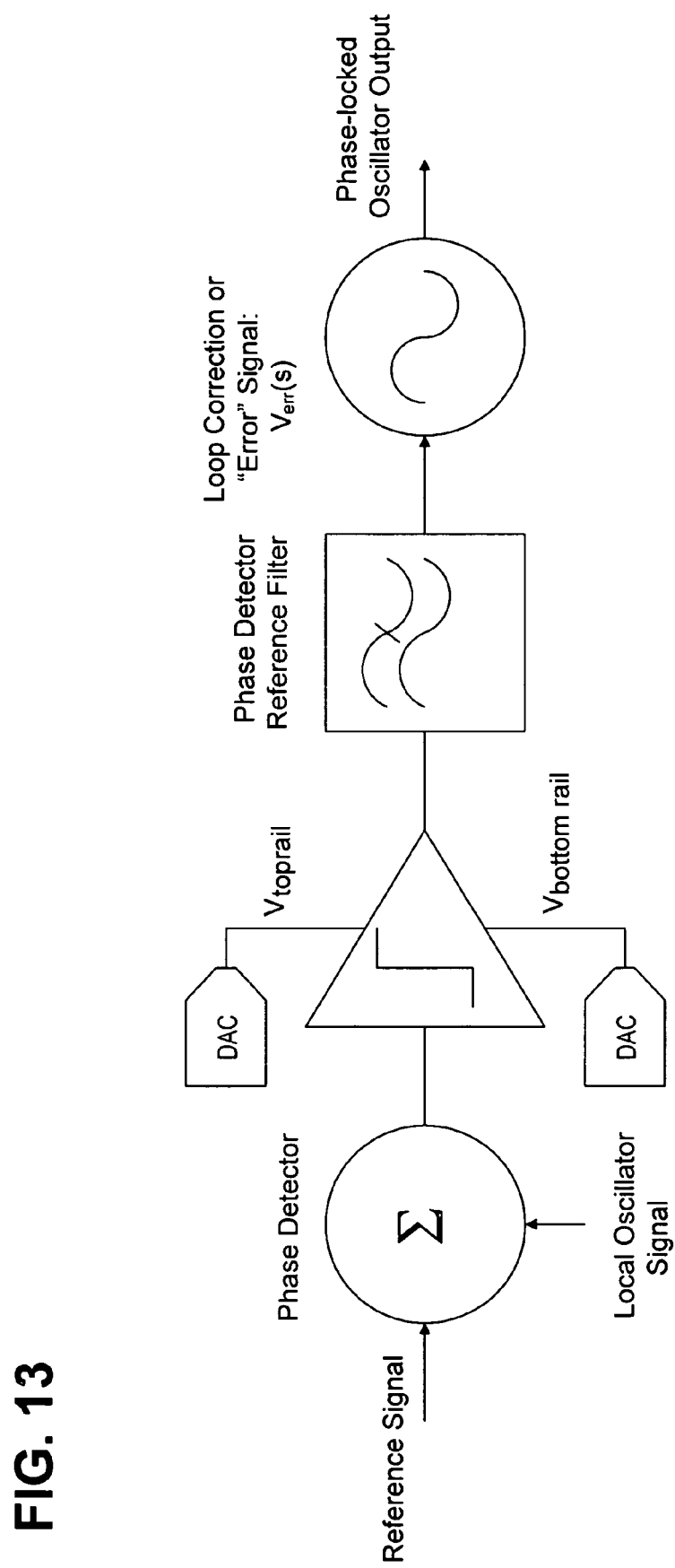
FIG. 13 illustrates a low noise, variable forward gain model.

Although the system in FIG. 12 eliminates the noise problem associated with the linear amplifier following the reference filter, it does not provide means of the forward gain since the limiting amplifier saturates the signal to the extremes of its power rails. Therefore, the reference filter is always averaging a signal between the same high and low voltage limit. If the limiting amplifier power voltage rails are adjusted, then the averaged DC output from the reference filter is variable, providing the desired variable loop gain required to set the 1$^{st}$ order loop corner frequency. An example of this system is shown in FIG. 13, which comprises a low noise, variable forward gain model.

Figure 14:
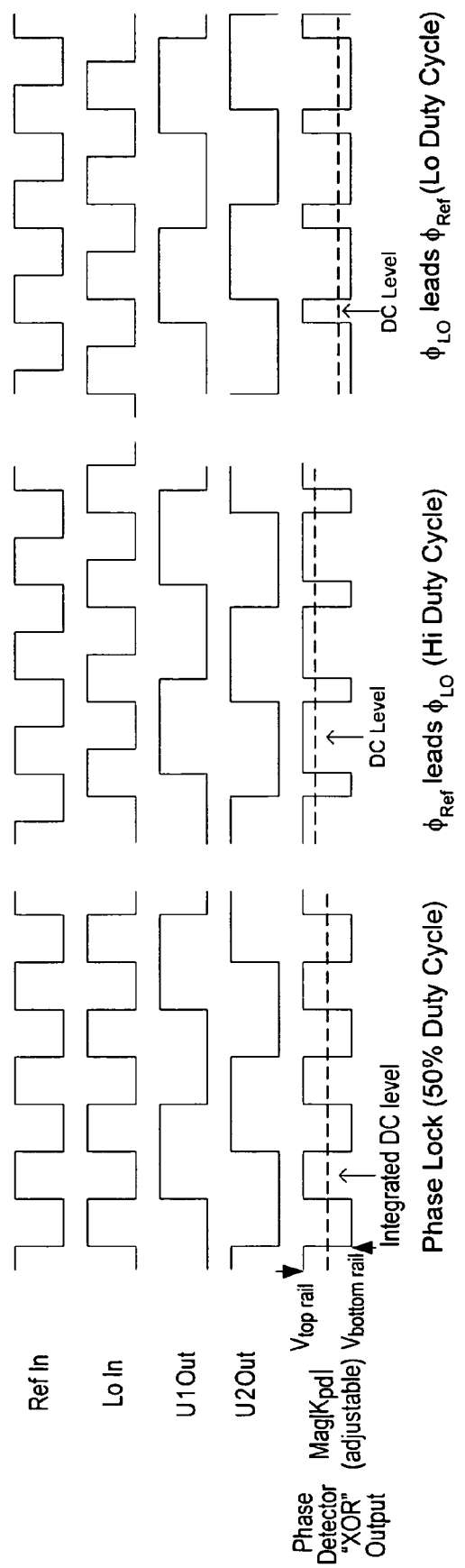
FIG. 14 illustrates the phase detector and reference filter signals.

FIG. 14 illustrates the function of the phase comparison detector and reference filter for various reference and LO signal phases. Refer to the phase lock (50% duty cycle) case. Assume the top rail voltage is 1 volt, and the bottom rail is 0 volts DC. The reference filter removes the comparison frequency, leaving the average of the duty cycle times the limiting amplifier rail voltage difference, or in this case, 0.5 VDC. If the top rail voltage is increased to 2V, then the resulting average is 1V, or twice the value obtained with the lower top rail voltage.

Adjustment of Passive Pole to Create a 2$^{nd}$ Order PLL with Variable Corner Frequency and Damping Factor To provide a second order response, a PLL must emulate the closed-loop gain $$clg(s)_{2ndOrder} = \frac{2\zeta\omega_n s + \omega_n^2}{(s^2 + 2\zeta\omega_n s + \omega_n^2)} = \frac{\frac{Ks}{N_{rc}} + \frac{Ka}{N_{rc}}}{\left(s^2 + \frac{Ks}{N_{lo}} + \frac{Ka}{N_{lo}}\right)}$$

transfer function in (2)

(Eqn 2)

where:

$$a = \frac{K}{4\zeta^2 N_{LO}}, \text{ and}: K = k_{pd}k_{vco}.$$

Figure 15:
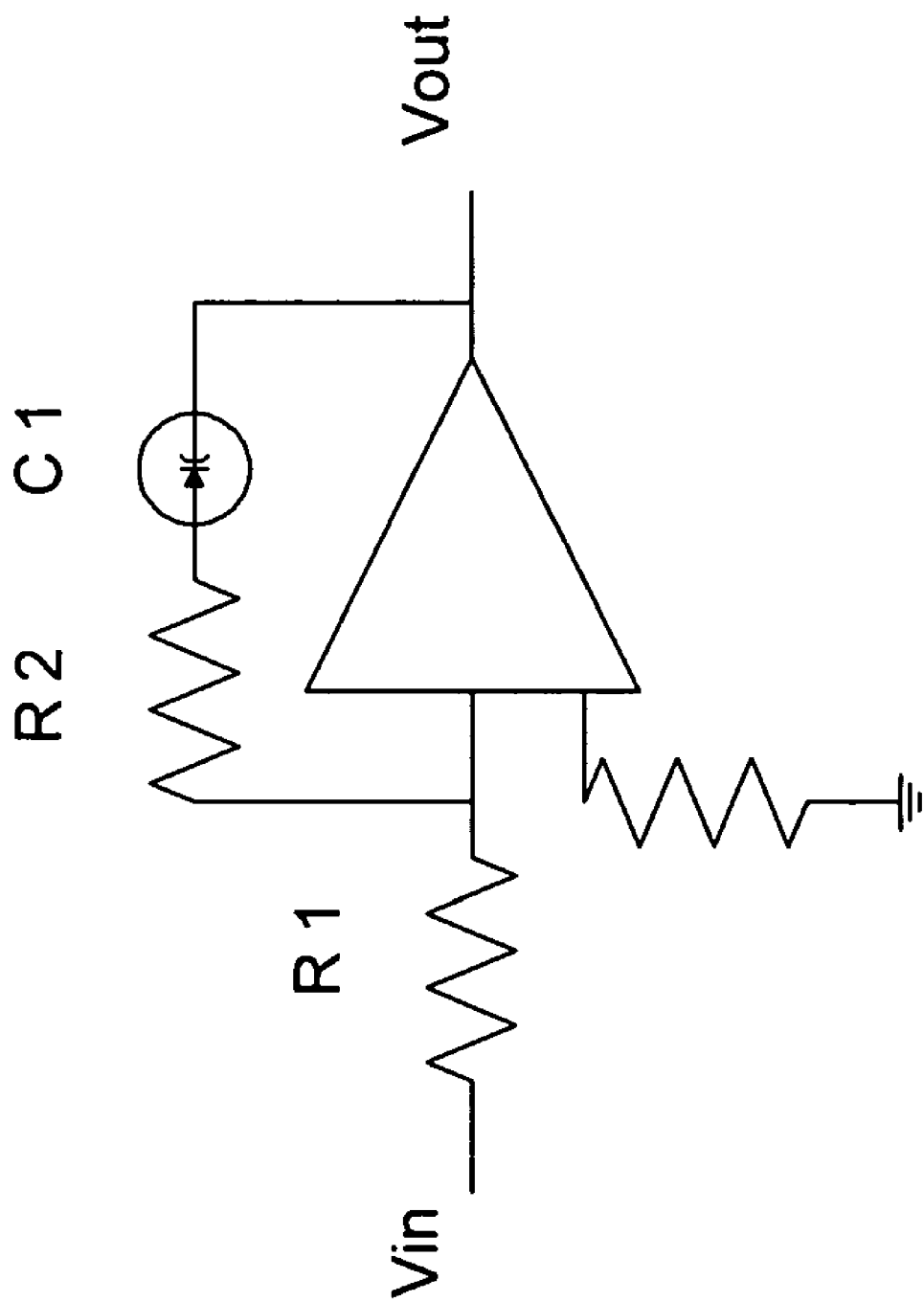
FIG. 15 is an active integrator with adjustable low-pass corner frequency

The required circuit for $K_f(s)$ is an integrator as illustrated in FIG. 15. The integrator has a transfer function of:

$$K_f(s) = \frac{a+s}{s} = \frac{1+sT_2}{1+sT_1}. \quad \text{(Eqn 3)}$$

By adjustment of the varactor capacitor in FIG. 15, and the phase detector gain in FIG. 13, the natural ring frequency, $\omega_n$, and the damping factor, $\zeta$, can be made variable and may be set for the desired 2$^{nd}$ order response. The values of R2 and R1 may be set for low linear amplifier gain to minimize additive forward loop gain noise. The phase detector limiting amplifier rail adjustment is used to set gain, K, to the appropriate level in equation 2.

VIII. Method of Generating a Phase Lock Loop Adjustable Rough Clock Frequency from Low Transition Density Serial Data A Phase Lock Loop (PLL) must be supplied a reference signal that is relatively constant over time such that the PLL circuit can "lock." In the case of a serial data stream, random data may run many data unit intervals (UI) without a transition. Even if the reference signal is missing momentarily (for a duration longer than the inverse of the PLL bandwidth), the PLL will lose lock until a reference signal is re-applied.

Figure 16:
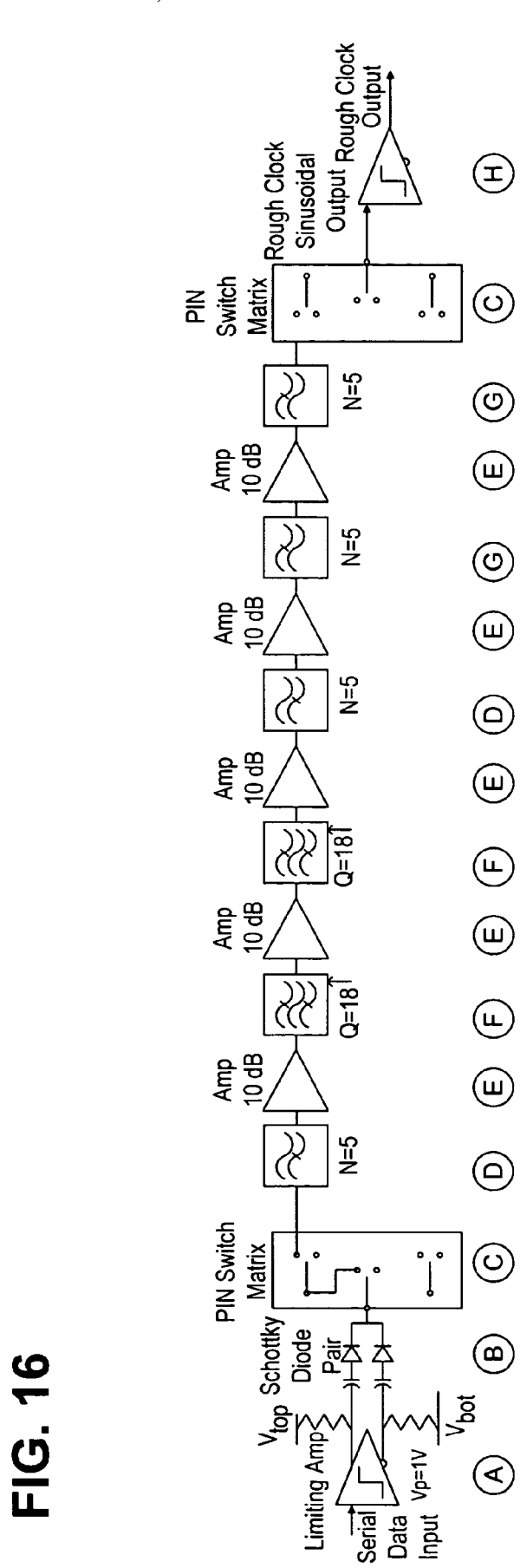
FIG. 16 illustrates the functional blocks for achieving a continuous running "rough" clock.

To keep the PLL supplied with a reference signal, it is necessary to sustain the reference signal during no-transition periods. A method of achieving a continuous running "rough" clock is shown in FIG. 16. The various blocks are labeled A-H in FIG. 16 and will be further described in connection with a method of controlling 1$^{st}$ order loop PLL corner frequency. First, the serial data stream is amplified to a high bandwidth limiting amplifier at (A) which creates short rise and fall time edges.

Second, the edges are high-pass filtered by the capacitors, and rectified by a Schottky diode pair at (B). The Schottky pair creates a uni-polar signal. When followed by a resonator (F), the system forms a frequency doubler, thus converting a data pattern with 1 UI period to a sinusoidal clock with frequency 1/UI.

Third, high and low-pass filters (D, G) eliminate undesirable out-band response.

Next, the resonance of the peaking resonator is adjustable and determines the output rough clock frequency. The resonance is achieved using a varactor diode and a high dielectric constant shorted ¼ wave resonator in parallel to create a resonance with a loaded quality factor or "Q" of approximately 20. An input calibration source, down-converter and FFT receiver can be used to monitor phase sidebands. The Schottky bias, and resonator peak frequency is then adjusted until the spurious sideband level is minimized in the FFT receiver. Once the spurious level is minimized, negligible deterministic is transferred to the PLL.

Fifth, by using two resonators in tandem separated by an amplifier (E, F) the overall Q is enhanced. The resonator chain will continue to supply a low-noise sinusoid for a run length of 30 missing transitions assuming the overall rough clock "Q" is 40.

Sixth, use of stage isolation amplifiers increases gain, and eliminate high "Q" stages from coupling and causing bifurcated responses.

Finally, the signal is converted to a digital clock signal using the limiting amplifier at (H). The signal can now serve as a reference signal to a phase lock loop.

It will be appreciated that the principles of this invention apply not only to devices for measuring data signals, but also to other environments in which clock recovery is desirable. While particular embodiments of the invention have been described with respect to its application, it will be understood by those skilled in the art that the invention is not limited by such application or embodiment or the particular components disclosed and described herein. It will be appreciated by those skilled in the art that other components that embody the principles of this invention and other applications therefor other than as described herein can be configured within the spirit and intent of this invention. The arrangements described herein are provided as examples of embodiments that incorporate and practice the principles of this invention. Other modifications and alterations are well within the knowledge of those skilled in the art.

The claimed invention is:

1. A method of suppressing non-ideal effects in a clock recovery system exhibited by a rough clock generator of the clock recovery system configured to receive a data signal and to deliver a rough clock signal, the rough clock generator including control parameters affecting operation of the rough clock generator, the method comprising:

receiving the rough clock signal with the clock recovery system;

mixing down the rough clock signal in the clock recovery system to a lower frequency, yielding a replicant rough clock signal;

observing the replicant rough clock signal in the clock recovery system to identify energy in spectral bands not native to the replicant clock signal; and adjusting at least one control parameter of the clock recovery system to reduce the energy in said spectral bands.

2. The method of claim 1, wherein the mixed down frequency is approximately zero hertz.

3. The method of claim 1, wherein the art of observing the replicant rough clock signal to identify energy in spectral bands not native thereto includes observing energy in sidebands of the mixed down frequency.

4. The method of claim 1, wherein the act of adjusting at least one control parameter comprises adjusting a duty cycle exhibited by the rough clock signal.

5. The method of claim 1, wherein the act of adjusting at least one control parameter comprises adjusting timing or amplitude of logic level transitions exhibited by the rough clock signal.

6. The method of claim 1, wherein the act of adjusting at least one control parameter comprises adjusting a resonant frequency of a resonator included within the rough clock generator.

* * * * *